TELEVISION TUNER

Filed Nov. 3, 1966

INVENTOR
JOE G. BADGER
by
Mason, Kolehmainen, Rathburn and Wyss
ATTORNEYS

INVENTOR
JOE G. BADGER
by
Mason, Kolehmainen,
Rathburn and Wyss
ATTORNEYS.

United States Patent Office 3,438,272

Patented Apr. 15, 1969

3,438,272

TELEVISION TUNER

Joe G. Badger, Bloomington, Ind., assignor to Sarkes Tarzian, Inc., Bloomington, Ind., a corporation of Indiana Filed Nov. 3, 1966, Ser. No. 591,750
Int. Cl. F16h 35/18
U.S. Cl. 74—10.8 4 Claims

ABSTRACT OF THE DISCLOSURE

A unitary television tuner is provided for receiving both VHF and UHF television stations, the UHF tuner portion being mounted on a common side member which is adapted to function as a common shielding member for both the VHF and UHF tuner portions.

The present invention relates to television tuners and, more particularly, to a unitary tuner construction suitable for use in the reception of both VHF and UHF television signals.

While certain arrangements have been heretofore proposed which included facilities for receiving both VHF and UHF television stations, these arrangements have in general been directed simply to the mounting of separate VHF and UHF tuners on a common mounting bracket. In particular, these prior art arrangements have not employed a common shielding member to provide at least partial electrical shielding for both the VHF and UHF portions of the tuner. In addition, these prior art VHF and UHF tuner arrangements have been somewhat bulky and have required a relatively large space within the television receiver cabinet. With increasing emphasis on smaller and more compact television receivers, there is increasing demand for a VHF-UHF tuner arrangement which is extremely compact and which will occupy a minimum of space within the television receiver cabinet.

A further disadvantage of prior art VHF-UHF arrangements involves the misalignment or misregistration of the UHF dial indicator. Normally, the UHF dial indicator is driven through a gear train from a common tuning knob which is concentric with the VHF station selector shaft. This control knob is usually of relatively large dimensions and the user is thus able to exert a substantial force on the input of the gear train when the UHF stops associated with the UHF tuner are reached. As a result, the individual gears of the gear train tend to separate. When this occurs the UHF dial indicator is no longer in registration with the UHF main tuning shaft and accordingly gives an erroneous indication of the particular UHF station to which the UHF tuner is tuned.

It is a primary object of the present invention to provide a new and improved unitary VHF-UHF television tuner arrangement in which one or more of the disadvantages of prior art arrangements is avoided.

It is another object of the present invention to provide a new and improved VHF-UHF tuner arrangement wherein gear separation and improper registration of the UHF dial indicator upon the application of a large force to the UHF control knob is avoided.

It is a further object of the present invention to provide a new and improved unitary VHF-UHF television tuner arrangement in which a common shielding member is employed to provide at least partial electrical shielding for both VHF and UHF portions of the unitary tuner.

It is still another object of the present invention to provide a new and improved unitary VHF-UHF tuner arrangement wherein the gearing interconnecting the VHF and UHF tuner portions is completely contained within the silhouette of the unitary tuner chassis so that the VHF-UHF tuner may be mounted in a minimum clearance space on the main television receiver chassis.

It is another object of the present invention to provide a new and improved unitary VHF-UHF television tuner arrangement wherein the gearing interconnecting the VHF and UHF portions of the tuner does not project beyond the edge of the tuner chassis and is protected from accidental damage thereby.

It is a still further object of the present invention to provide a new and improved unitary VHF-UHF television tuner arrangement wherein a two-step intermediate gear is employed to provide the correct drive ratio between the VHF and UHF tuner portions.

Briefly, in accordance with one aspect of the invention, the UHF tuner portion is mounted within the VHF tuner enclosure and, specifically, is mounted on a side wall member of the VHF tuner. This side wall member thus acts as a partial shield both for the VHF portion and for the UHF portion of the VHF-UHF television tuner arrangement. In addition, this side wall member is separately removable so as to permit removal of the UHF tuner portion for service and repair.

In accordance with a further aspect of the invention, a two-step intermediate gear arrangement is employed to drive the UHF main tuning shaft so that the entire gear train is situated within the periphery of the overall tuner chassis and an extremely compact VHF-UHF tuner arrangement is provided.

In accordance with a still further aspect of the invention, a stop arrangement is provided in connection with the UHF drive mechanism whereby gear separation and consequent misalignment of the UHF dial indicator is positively prevented.

The invention, both as to its organization and method of operation, together with further objects and advantages thereof, will best be understood by reference to the following specification taken in connection with the accompanying drawings in which.

Figures 1, 2:
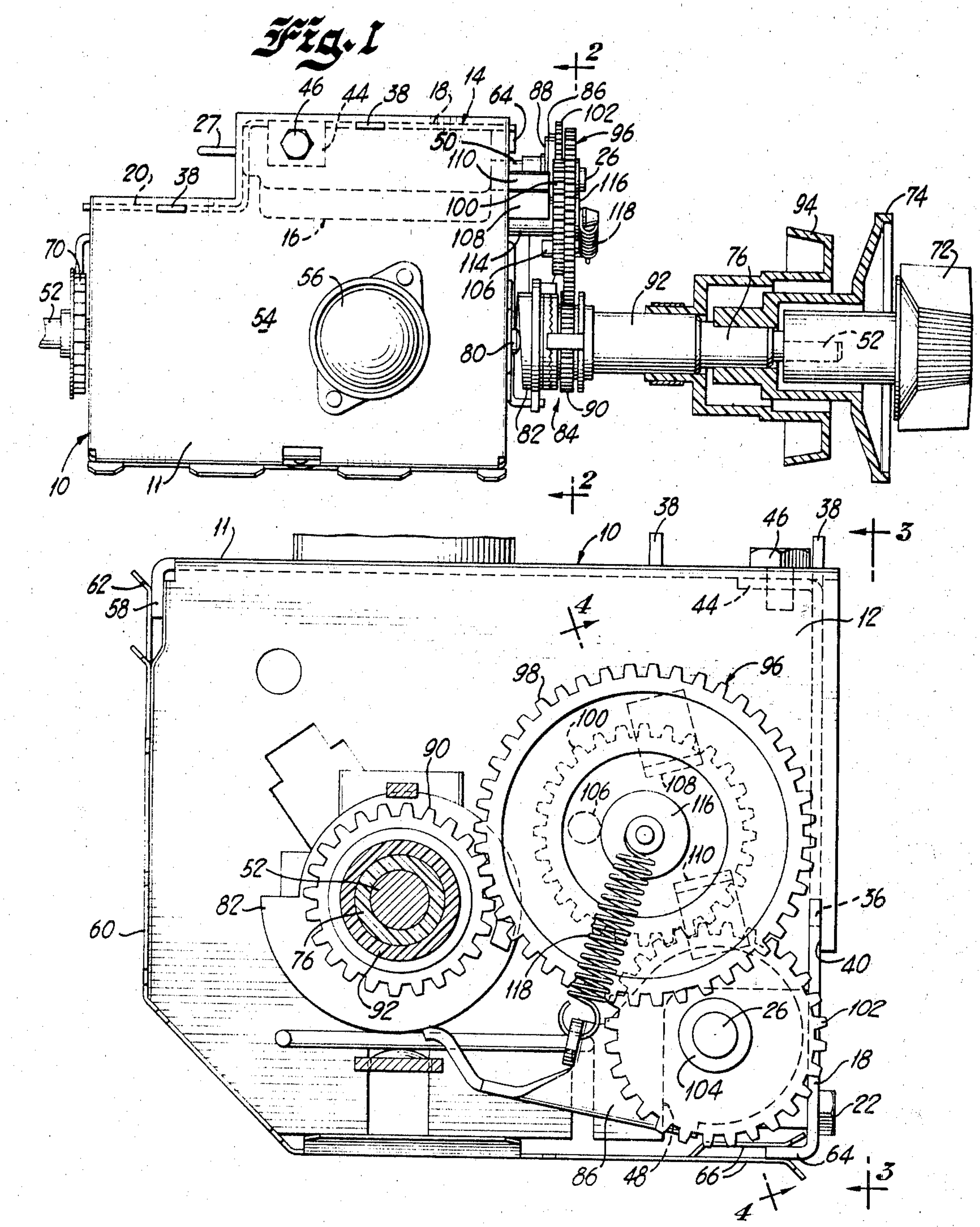
FIG. 1 is a top plan view of a unitary VHF–UHF television tuner embodying the features of the present invention.
FIG. 2 is a sectional view taken along the lines 2—2 of FIG. 1.

Referring now to the drawings, the unitary VHF–UHF television tuner of the present invention is therein disclosed as comprising a generally U-shaped chassis member indicated generally at 10, having a top wall 11, a front wall 12 and a rear wall 13. A side wall member 14 is secured to the chassis member in a manner to be described in more detail hereinafter and supports the UHF tuner portion indicated generally at 16 thereon. The side wall member 14 includes a first portion 18 which acts as an electrical shield for the UHF tuner portion 16 and a second offset portion 20 which acts as a partial electrical shield for the VHF tuner portion of the unitary tuner of the present invention, as will be described in more detail hereinafter.

Figure 3:
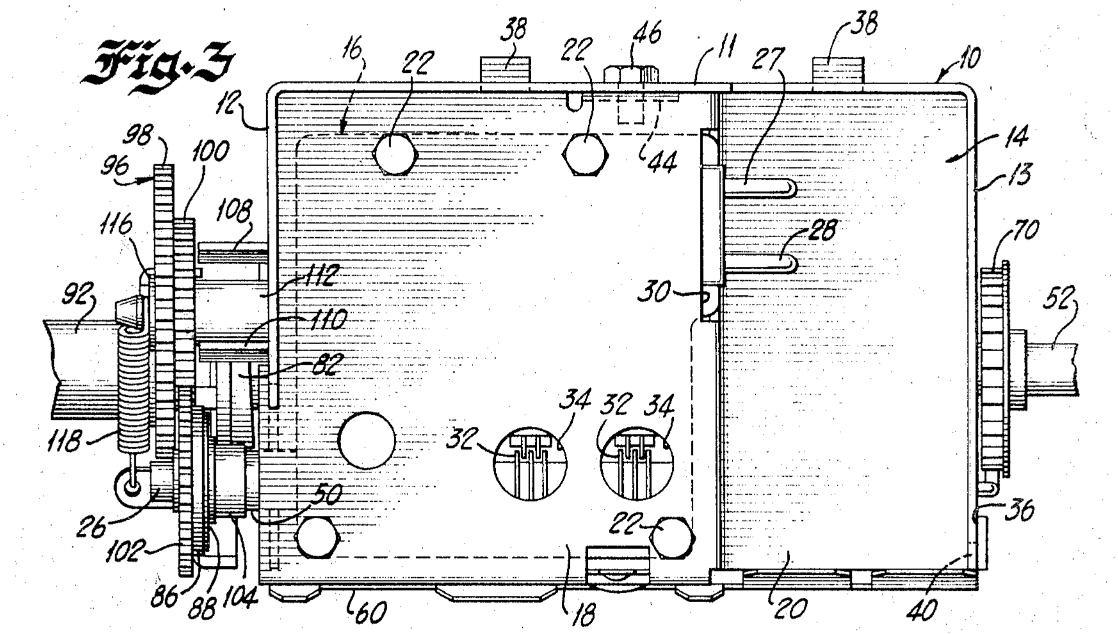
FIG. 3 is a side view taken along the lines 3—3 of FIG. 2 on a somewhat larger scale.

The UHF tuner portion 16 is secured to the side wall portion 18 by means of the screws 22 and comprises a housing 24 from one end of which a main UHF tuning shaft 26 projects. Preferably, the openings in the wall portion 18 for the screws 22 are in the form of slots so as to permit the UHF main tuning shaft 26 to be adjusted vertically for reasons to be described hereinafter. The antenna input to the UHF tuner portion 16 is provided by a pair of input terminal prongs 27, 28 which project through an opening 30 (FIG. 3) in the side wall member 14. The main tuning shaft 26 carries a plurality of tuning members in the form of capacitor plates 32 within the housing 24, these plates being adjustable through the openings 34 provided in the wall portion 18 and providing variable tuned circuits for selection of a desired UHF signal and heterodyning the same to a common intermediate frequency signal, as will be readily understood by those skilled in the art. The openings 34 may, if desired, be closed by suitable sheet metal plugs to provide complete shielding of the UHF tuner portion 16.

The side wall member 14 is provided with a pair of notches 36 and a pair of tongue portions 38 which are adapted respectively to engage the notches 40 and slots 42 provided in the U-shaped chassis member 10 so that the side wall member 20 may be rigidly mounted on and form a part of the unitary chassis of the VHF–UHF tuner, the side wall member 14 being provided with a right angle flange 44 which is employed to receive a mounting screw 46 which holds the side wall member 14 in its assembled position. The UHF tuner portion 16 may thus be readily disassembled for service or repair by simply removing the single screw 46. It will be noted that the front wall portion 12 of the chassis member 10 is provided with a corner opening 48 which provides clearance for the UHF main tuning shaft 26 and its mounting hub 50.

Referring now to the VHF tuner portion of the unitary VHF–UHF tuner of the present invention a VHF station selector shaft 52 is rotatably mounted between the end walls 12 and 13 of the chassis member 10 and the VHF tuning components are positioned within the space 54 defined by the side wall member 20, the UHF housing 16, and the chassis member 10, the VHF RF oscillator and mixer tubes 56 and 57 being mounted on the top wall 11 of the member 10. The top wall 11 is provided with a down turned flange 58 and a generally L-shaped shield plate 60 is provided to enclose the other side and bottom of the tuner chassis, as shown in FIG. 2. More particularly, the shield member 60 is provided with flexible tongue portions 62 which are adapted to engage and interlock with the flange 58, the side member 18 is provided with an inturned flange 64 and the shield 60 is provided with fingers 66 which engage the flange 64. As a result, a totally enclosed and shielded tuner construction is provided.

Figure 5:
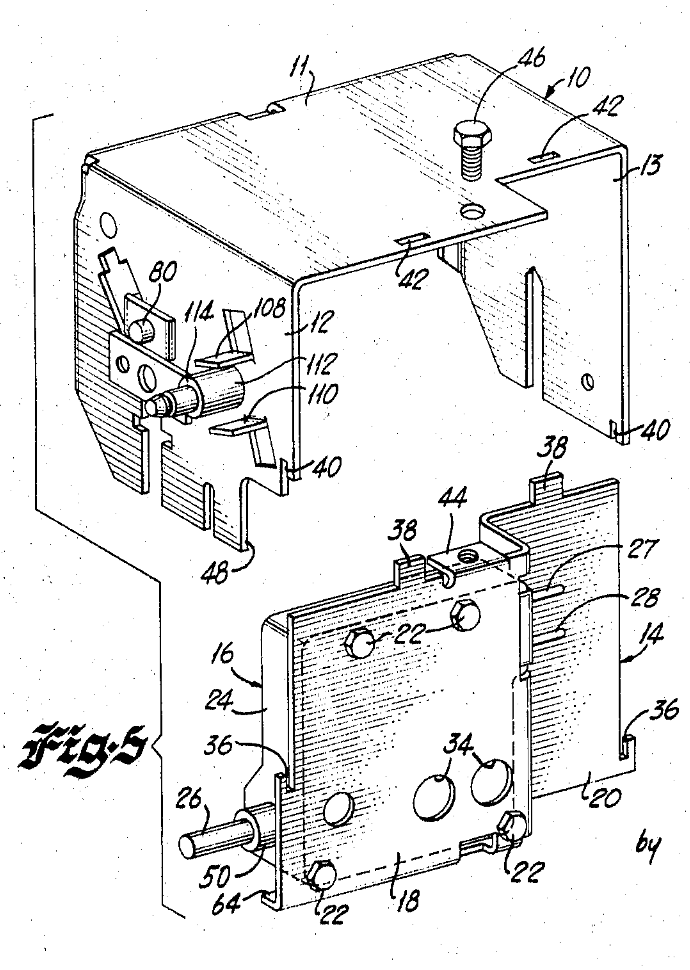
FIG. 5 is an exploded view showing the manner in which the parts are assembled to provide a unitary VHF–UHF tuner construction.

The VHF tuner shaft 52 is provided with a detent wheel arrangement 70 on the rear end of the tuner and a station selector knob 72 is connected to the front end of the shaft 52, so that VHF television stations can be selected. A combined VHF fine tuning and UHF station selection knob 74 is connected to the forward end of a hollow tuning shaft 76 which is concentric with the station selector shaft 52. The VHF tuner portion of the unitary tuner includes a fine tuning element having an axially adjustable tuning member 80 (FIG. 5) which is arranged to be adjusted in response to rotation of the tuning shaft 76 by means of a dual function cam member 82 and an interconnected drive arrangement indicated generally at 84. For a more complete and detailed description of elements 82 and 84 and the manner in which these elements function for VHF and UHF reception, reference may be had to Valdettaro United States Patent No. 3,251,234. However, for the purposes of the present invention, it may be stated that rotation of the tuning knob 74 is converted by the cam 82 into axial adjustment of the tuning member 80 and consequent fine tuning adjustment of the tuner to a selected VHF television station. During UHF reception, the periphery of the dual function cam member 82 is employed to effect a slow speed or vernier tuning adjustment to a selected UHF television station by means of a cam follower member 86 which is connected to the UHF main tuning shaft 26 through a slip clutch arrangement 88.

In accordance with an important feature of the present invention, the tuning member 76 is arranged to drive the UHF main tuning shaft 26 through a gearing arrangement which provides the proper gear ratio between these elements without extending beyond the confines of the chassis so that this gearing is protected from damage and at the same time provides a chassis construction which is of minimum dimensions and which may be mounted within a minimum space in the television receiver cabinet. More particularly, this direct drive arrangement between the shafts 76 and 26 includes a first gear element 90 which is formed on one end of a rotatable sleeve member 92 mounted concentric with the tuning member 76. As illustrated in FIG. 1, the sleeve 92 supports on the outer end thereof a UHF indicator dial 94 which is arranged to indicate the particular UHF station to which the tuner arrangement is tuned.

The gear 90 is arranged to be driven from the control knob 74 through the mechanism 84 when the cam 82 reaches its stops, as described in more detail in U.S. Patent No. 3,251,234.

Figure 4:
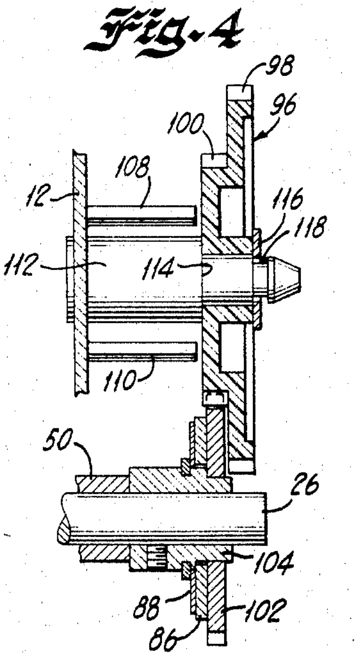
FIG. 4 is a sectional view taken along the lines 4—4 of FIG. 2.

The gear 90 meshes with a two-step intermediate gear element indicated generally at 96, the element 96 having gear teeth 98 formed in the outer rim thereof which engage the teeth of the gear 90. A smaller diameter set of gear teeth 100, which are formed integrally on the element 96 behind the teeth 98 are positioned in engagement with a gear 102 which is secured to a hub portion 104 connected to the UHF main tuning shaft 26 (FIG. 4). The intermediate gear element 96 is also provided with a rearwardly extending stop post 106 which is arranged to engage either one of a pair of forwardly projecting lug portions 108 and 110 which are struck up out of the front wall 12. The intermediate gear element 96 is rotatably mounted on a post 112 which is secured to the front wall 12 and is provided with a shoulder 114 on which the gear element 96 rides. A washer 116 holds the gear element 96 on the post 112, the washer 116 being held in place by the end of the coil spring 118 which biases the cam follower 86 against the edge of the cam element 82.

Considering now the operation of the above-described arrangement, it is first pointed out that the indicator sleeve 92 must rotate somewhat less than 360 degrees so that all of the UHF stations will be indicated within one revolution of the indicator 94 and without overlap. On the other hand, the main tuning shaft 26 of the UHF tuner portion 16 travels only somewhat less than 180 degrees to select or tune in all of the UHF channels. Accordingly, it is necessary to have an approximately two-to-one step-down ratio between the sleeve 92 and the shaft 26 in order to indicate the UHF channels in proper correlation or registry with the main tuning shaft 26. If this step down ratio is provided by employing a large gear on the UHF shaft 26, as in United States Patent No. 3,251,234, the overall dimensions of the tuner package are substantially increased. Furthermore, the provision of a large gear on the main tuning shaft 26 results in a construction in which this gear projects beyond the edge of the tuner chassis and is quite susceptible to injury in production, shipment and installation in the television receiver.

These disadvantages are obviated in the described arrangement by employing the two-step gear element 96. With this arrangement the desired step-down ratio is provided between the gears 90 and 98 while at the same time the gears 100 and 102 have an approximately one-to-one gear ratio. Such construction positions the intermediate gear element 96 within the confines of the tuner chassis and permits the use of a substantially smaller gear 102 on the UHF main tuning shaft 26. As a result, an extremely compact tuner package is provided wherein none of the gear elements project beyond the edge of the chassis and hence are protected from damage. Also, by providing the post 106 as an integral part of the intermediate gear element 96, the maximum travel of the UHF tuning shaft 26 is limited in an extremely simple and economical manner by having the post 106 engage the edges of the stop lugs 108 and 110.

In accordance with a further feature of the invention, the post 106 and lugs 108 and 110 are arranged to prevent gear separation and misalignment or improper registration of the UHF indicator dial 94. It will be noted that the control knob 74 is of substantial diameter and hence a relatively large torque may be exerted by the user on the gear 90. Accordingly, a relatively large force may be applied to the gear 90 when the post 106 is moved against one of the lugs 108 or 110. In conventional gear drive arrangements, this force tends to separate the driving gears with the result that UHF indicator dial 94 is no longer properly registered or correlated with movement of the UHF main tuning shaft 26. However, in the arrangement of the present invention, the lugs 108 and 110 are positioned with respect to the post 106 to provide an arrangement in which a force is developed tending positively to prevent the gears from separating. Thus, assuming that the post 106 has been moved against the stop 110 (FIG. 2), a clockwise force is exerted on the gear 90 which is translated into a counterclockwise force in the gear 98. However, since the post 106 is positioned against the edge of the lug 110, a force is developed with the lug 110 acting as a fulcrum and this force tends to hold the gears 90 and 98 in mesh and prevent them from separating. In a similar manner, when the post 106 is moved against the stop 108 a counterclockwise force is developed in the gear 98 and the lug 108 acts as a fulcrum so that a force is developed tending to hold the gears 90 and 98 in mesh. Accordingly, when a large force is exerted on the gear in either of the limiting positions of UHF tuning, the gears 90 and 98 do not tend to separate and proper registration of the UHF indicator dial 94 with the UHF main tuning shaft 26 is insured.

It will also be noted that by providing the post 106 on the intermediate gear element 96 and restraining this element by means of the stops 108 and 110, the large forces described above are exerted only on the gear elements 90 and 98. The internal stops normally provided for the UHF main tuning shaft 26 within the housing 16 are thus not relied upon to resist the large external forces which may be developed in the manner described heretofore. Also, since the intermediate gear element 96 is restrained by the stops 108 and 110, no large forces tending to separate the gear elements 100 and 102 are developed. As discussed heretofore, the UHF tuner portion 16 may be adjusted vertically with respect to the wall portion 18, by providing slots for the mounting screws 22 so that the gear 102 on the main tuning shaft 26 may be adjusted vertically to the point at which the gears 100 and 102 are in meshing engagement with a minimum of backlash.

While there has been illustrated and described a single embodiment of the present invention, it will be apparent that various changes and modifications therof will occur to those skilled in the art.

What is claimed as new and desired to be secured by Letters Patent of the United States is:

1. A unitary television tuner suitable for receiving both VHF and UHF television stations, comprising a U-shaped frame having top, front and rear walls, a side member connected to said top, front and rear walls along one edge thereof, a UHF tuner portion having a main tuning shaft and mounted on said side member with said main tuning shaft extending through said front wall of said frame, a VHF tuner portion including a VHF tuner shaft rotatably mounted on said front and rear walls of said frame, a common VHF and UHF tuning member concentric with said VHF tuner shaft, gear means including an intermediate gear rotatably mounted on said front wall of said frame for driving said UHF main tuning shaft from said common tuning member, a pair of stop members integrally formed in said front wall of said frame, and a lug on said intermediate gear and adapted to engage said pair of stop members, thereby to limit the movement of said UHF main tuning shaft to a desired amount.

2. A unitary television tuner as set forth in claim 1, wherein said intermediate gear is a two-step gear to provide a driving ratio between said common tuning member and said UHF main tuning shaft of approximately two to one.

3. A unitary television tuner as set forth in claim 1, wherein said side member is provided with interlocking means adapted to cooperate with said top, front and rear walls of said frame so that said side member is removably mounted on said frame and said UHF tuner may be removed as a unit for service and repair.

4. A unitary television tuner suitable for receiving both VHF and UHF television stations, comprising a VHF tuner portion having a fine tuning element, a VHF station selector shaft, rotatably mounted on said front and rear walls, a combination VHF fine tuning and UHF tuning member concentric with said VHF station selector shaft, means interconnecting said combination tuning member with said fine tuning element to provide a VHF fine tuning operation upon rotation of said combination tuning member, a first gear arranged to be driven from said combination member, a UHF tuner portion having a main tuning shaft, a second gear on said main tuning shaft, and gearing means interconnecting said first and second gears, said gearing means including a third gear in mesh with said first gear and a fourth gear in mesh with said second gear, said third and fourth gears being integrally mounted for rotation about a common axis, said first and second gears and said third and fourth gears being arranged such that said UHF main tuning shaft is driven from said combination tuning member at a ratio of approximately two to one, said fourth gear being provided with a rearwardly extending lug, and stationary stop means adapted to engage said lug and limit the travel of said UHF main tuning shaft.

References Cited

UNITED STATES PATENTS

| | | | |
|---|---|---|---|
| 2,177,760 | 10/1939 | Wheat | 74—10.8 |
| 3,251,234 | 5/1966 | Valdettaro | 74—10.8 X |

MILTON KAUFMAN, *Primary Examiner.*

U.S. Cl. X.R.

74—10.45, 10.54